(12) United States Patent
Chang-Chien et al.

(10) Patent No.: US 7,004,015 B2
(45) Date of Patent: Feb. 28, 2006

(54) METHOD AND SYSTEM FOR LOCALLY SEALING A VACUUM MICROCAVITY, METHODS AND SYSTEMS FOR MONITORING AND CONTROLLING PRESSURE AND METHOD AND SYSTEM FOR TRIMMING RESONANT FREQUENCY OF A MICROSTRUCTURE THEREIN

(75) Inventors: Patty P. L. Chang-Chien, Hermosa Beach, CA (US); Kensall D. Wise, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 273 days.

(21) Appl. No.: 10/274,593

(22) Filed: Oct. 21, 2002

(65) Prior Publication Data

US 2003/0089394 A1 May 15, 2003

Related U.S. Application Data

(60) Provisional application No. 60/336,292, filed on Oct. 25, 2001.

(51) Int. Cl.
*G01M 3/00* (2006.01)
*H01L 21/66* (2006.01)
*H01L 21/00* (2006.01)

(52) U.S. Cl. .......................................................... 73/52
(58) Field of Classification Search ................ 438/15, 438/51, 52, 106; 73/52, 704; 257/682
See application file for complete search history.

(56) References Cited

U.S. PATENT DOCUMENTS

| | | | | |
|---|---|---|---|---|
| 5,976,994 A | | 11/1999 | Nguyen et al. ............. 438/795 |
| 6,169,321 B1 | | 1/2001 | Nguyen et al. ............. 257/536 |
| 6,232,150 B1 | | 5/2001 | Lin et al. | |
| 6,297,072 B1 | * | 10/2001 | Tilmans et al. ............. 438/106 |
| 6,436,853 B2 | * | 8/2002 | Lin et al. .................... 438/800 |
| 6,534,850 B2 | * | 3/2003 | Liebeskind ................. 257/682 |

OTHER PUBLICATIONS

Enikov, Eniko T., et al., Electroplated Electro–Fluidic Interconnects For Chemical Sensors, Sensors and Actuators 84, 2000, pp. 161–164.

Cheng, Y.T., et al., Fabrication And Hermeticity Testing of A Glass–Silicon Package Formed Using Localized Aluminum/Silicon–To–Glass Bonding, IEEE, 2000, pp. 757–762.

Wang, Yuelin, et al., The Structures For Electrostatic Servo Capacitive Vacuum Sensors, Sensors and Actuators A 66, 1998, 213–217.

Lin, Liwei, MEMS Post–Packaging by Localized Heating and Bonding, IEEE, 2000, pp. 608–616.

(Continued)

*Primary Examiner*—Hezron Williams
*Assistant Examiner*—Tamiko Bellamy
(74) *Attorney, Agent, or Firm*—Brooks Kushman P.C.

(57) ABSTRACT

A method and system for locally sealing a vacuum microcavity, methods and systems for monitoring and controlling pressure in the microcavity and method and system for trimming resonant frequency of a microstructure in the microcavity are provided. The microcavity has an initial base pressure therein after the microcavity is locally sealed at an access passageway. The monitoring and control methods include measuring pressure in the microcavity and providing a signal when the pressure exceeds a maximum desired level. The control method also includes reducing the pressure in the microcavity to a pressure at or below the maximum desired level in response to the signal to compensate for vacuum degradation within the vacuum microcavity.

4 Claims, 5 Drawing Sheets

OTHER PUBLICATIONS

Cheng, Yu-Ting, Localized Heating and Bonding Technique For MEMS Packaging, University of Michigan, 2000, pp. 1-109.

Cheng, Y.T., et al., Localized Bonding with PSG or Indium Solder as Intermediate Layer, IEEE, 1999, pp. 285-289.

Guckel, H., et al., Planar Processed Polysilicon Sealed Cavities For Pressure Transducer Arrays, IEDM, 1984, pp. 223-225.

Henmi, H., et al., Vacuum Packaging For Microsensors By Glass-Silicon Anodic Bonding.

Lin, Liwei, et al., Vacuum-Encapsulated Lateral Microresonators, $7^{th}$ International Conference on Solid-State Sensors and Actuators, Berkley, California, pp. 270-273.

Chang-Chien, Patty P.L., et al., Wafer-Level Packaging Using Localized Mass Deposition, Eurosensors XV, The $11^{th}$ International Conference on Solid-State Sensors And Actuators, Munich, Germany, Jun. 10-14, 2001, pp. 182-185.

Enikov, Eniko T., et al., Electroplated Electro-Fluidic Interconnects For Chemical Sensors, Sensors and Actuators 84, Elsevier Science, vol. 84, No. 1-2, Aug. 1, 2000, pp. 161-164.

Cheng, Y.T., et al., Localized Bonding With PSG Or Indium Solder As Intermediate Layer, Proceedings of IEEE International Conference on Micro Electro Mechanical Systems, Orlando, 1999, pp. 285-289.

Cheng, Y.T., et al., Fabrication And Hermeticity Testing Of A Glass-Silicon Package Formed Using Localized Aluminum/Silicon-To-Glass Bonding, International MEMS Conference, 2000, pp. 757-762.

Lin, Liwei, MEMS Post-Packaging By Localized Heating And Bonding, IEEE Transactions On Advanced Packaging, vol. 23, No. 4, Nov. 2000, pp. 608-616.

Wang, Yuelin, et al., The Structures For Electrostatic Servo Capacitive Vacuum Sensors, Sensors And Actuators, A66, 1998, pp. 213-217.

Guckel, H., et al., Planar Processed Polysilicon Sealed Cavities For Pressure Transducer Arrays, IEEE International Electron Devices Meeting, Technical Digest, IEDM '84, pp. 223-225, San Francisco, 1984.

Yu-Ting, Cheng, Localized Heating And Bonding Technique For MEMS Packaging, Ph.D Dissertation, University of Michigan, 2000.

Henmi, H., et al., Vacuum Packaging For Microsensors By Glass-Silicon Anodic Bonding, International Conference ON Solid State Sensors And Actuators, Transducers 93, pp. 584-587, 1993.

Lin, Liwei, et al., Vacuum-Encapsulated Lateral Microresonators, Digest of Technical Papers, $7^{th}$ International Conference on Solid State Sensors and Actuators, pp. 270-273, Yokohama, Jun. 1993.

* cited by examiner

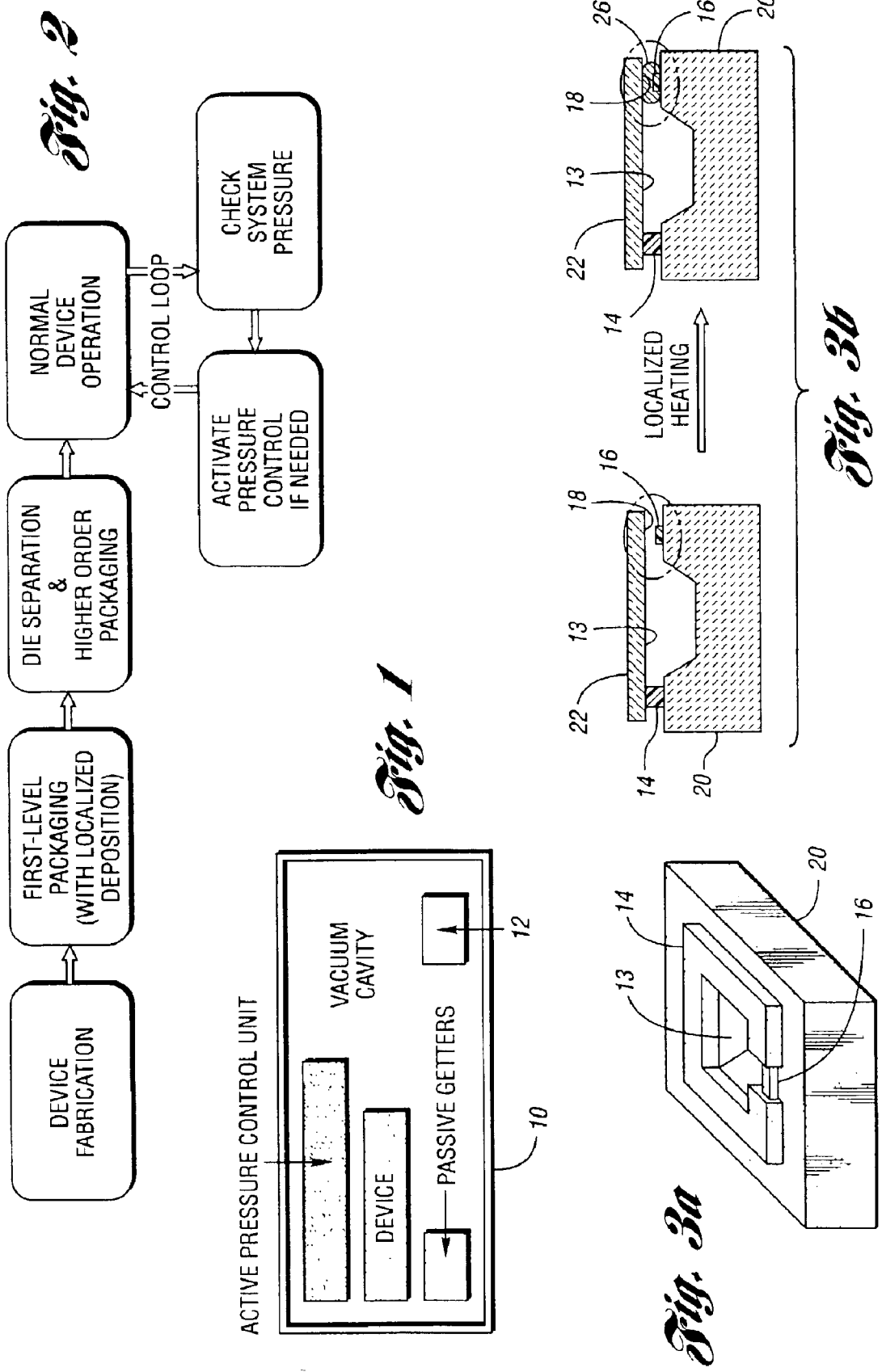

METHOD AND SYSTEM FOR LOCALLY SEALING A VACUUM MICROCAVITY, METHODS AND SYSTEMS FOR MONITORING AND CONTROLLING PRESSURE AND METHOD AND SYSTEM FOR TRIMMING RESONANT FREQUENCY OF A MICROSTRUCTURE THEREIN

CROSS-REFERENCE TO RELATED APPLICATION

This application claims the benefit of U.S. provisional application Ser. No. 60/336,292, filed Oct. 25, 2001.

STATEMENT REGARDING FEDERALLY SPONSORED RESEARCH OR DEVELOPMENT

This invention was made with government support under DARPA Grant No. F30602-98-2-0227. The Government has certain rights in the invention.

BACKGROUND OF THE INVENTION

1. Field of the Invention

This invention relates to methods and systems for locally sealing a vacuum microcavity, methods and systems for monitoring and controlling pressure and methods and systems for trimming resonant frequency of a microstructure therein.

2. Background Art

Packaging is one of the most challenging and costly processes in the IC and sensor industry. Despite the enormous efforts and technological advances in this area during recent years, IC packaging remains a bottleneck for IC commercialization. With moving components, the already challenging packaging task is complicated further for MEMS devices. Thus far, packaging methods reported in the literature are application specific, and there is a lack of standardization in wafer-level MEMS device packaging. Furthermore, high, unpredictable, residual pressures inside the cavity and vacuum degradation over time are major obstacles in packaging high-performance MEMS devices such as high-quality factor resonators and absolute pressure sensors. For example, a prior art absolute pressure sensor is capable of resolving pressure changes of 25 mTorr and can be packaged at wafer level; however, it has much lower absolute sensitivity due to the variable pressures in the reference cavity.

Reactive Sealing

One of the earliest and best reactive sealing techniques was described by Guckel and Burns in their article "Planar Processed Polysilicon Sealed Cavities for Pressure Transducer Arrays", IEEE International Electron Devices Meeting, TECHNICAL DIGEST, IEDM '84, pp. 223–225, San Francisco, 1984. A cavity with a thin gap, which is defined by a sacrificial layer, was sealed with thermal oxidation. Sealed cavities (or microshells) can also be formed by deposited films. LPCVD films are typically used because of their excellent step coverage, as described by L. Lin, K. McNair, R. T. Howe, and A. P. Pisano in "Vacuum Encapsulated Lateral Microresonators," DIGEST OF TECHNICAL PAPERS, 7th International Conference on Solid State Sensors and Actuators, pp. 270–273. Yokohama, June 1993. This sealing method is also referred to as shadow plugging, because the deposited thin film does not coat the interior of the cavity.

Localized Heating and Bonding

Localized heating and bonding have been utilized to package MEMS devices by Cheng et al. as described in the following documents:

Y. T. Cheng, L. Lin and K. Najafi, "Localized Bonding with PSG or Indium Solder as Intermediate Layer", PROC. OF IEEE INTERNATIONAL CONFERENCE ON MICRO ELECTRO MECHANICAL SYSTEMS, pp. 285–289, Orlando, 1999;

Yu-Ting Cheng, "Localized Heating and Bonding Technique for MEMS Packaging", Ph.D. Dissertation, University of Michigan, 2000;

Y. T. Cheng, L. Lin and K. Najafi, "Fabrication and Hermeticity Testing of a Glass-Silicon Packaging Formed Using Localized Aluminum/Silicon-to-Glass Bonding", INTERNATIONAL MEMS CONFERENCE, pp. 757–762, 2000; and L. Lin, "MEMS Post-Packaging by Localized Heating and Bonding", IEEE TRANSACTIONS ON ADVANCED PACKAGING, Vol. 23, No. 4, pp. 608–616, Nov. 2000.

A microheater defines the perimeter of the cavity, and is used to raise the temperature locally in order to achieve one of the following: (1) reflow the heater material itself, such as Al, to seal the cavity; (2) reflow an intermediate layer, such as PSG or solder, to seal the cavity; or (3) raise the temperature locally to induce a chemical reaction between adjacent materials to seal the cavity (localized fusion bonding and eutectic bonding).

Cavity Pressure Control Using NEG (Non-Evaporable Getters)

Several MEMS devices have been packaged by implementing active non-evaporable getters inside an anodically bonded cavity as described in the following articles:

H. Henmi, S. Shoji, Y. Shoji, K. Yosimi and M. Esashi, "Vacuum Package for Microresonators by Glass-Silicon Anodic Bonding", INTERNATIONAL CONFERENCE ON SOLID STATE SENSORS AND ACTUATORS, TRANSDUCERS 93, pp. 584–587, 1993.

Y. Wang, M. Esashi, "The Structures for Electrostatic Servo Capacitive Vacuum Sensors", SENSORS AND ACTUATORS, A66, pp. 213–217, 1998.

U.S. Pat. Nos. 5,976,994 and 6,169,321 disclose a method and system for locally annealing a microstructure formed on a substrate.

SUMMARY OF THE INVENTION

An object of the present invention is to provide an improved method and system for locally sealing a vacuum microcavity, methods and systems for monitoring and controlling pressure and method and system for trimming resonant frequency of a microstructure therein which solve one or more of the above-noted problems associated with the prior art.

In carrying out the above object and other objects of the present invention, a method for locally sealing a vacuum microcavity is provided. The method includes providing a device having an access passageway communicating the vacuum microcavity with ambient. The method also includes plugging the access passageway with material to locally seal the vacuum microcavity.

The method may further include evacuating gas from the microcavity wherein the sealed microcavity has an initial base pressure therein.

Further in carrying out the above object and other objects of the present invention, a system is provided for locally sealing a vacuum microcavity formed in a device having an access passageway communicating the vacuum microcavity with ambient. The system includes a mechanism for plugging the access passageway with material to locally seal the vacuum microcavity.

The mechanism may include a sealing heater located at the access passageway for causing the material to plug the access passageway.

Still further in carrying out the above object and other objects of the present invention, a method for monitoring pressure in a vacuum microcavity is provided. The method includes measuring pressure in the microcavity and providing a signal when the pressure exceeds a maximum desired level.

The step of measuring may be performed either directly or indirectly.

The vacuum microcavity may be a sealed microcavity, and the step of measuring is performed in the sealed microcavity.

The sealed microcavity may have an initial base pressure therein less than the maximum desired level.

A plugged access passageway may be located between the microcavity and ambient.

The step of measuring may be performed by a pressure-sensitive measuring device located within the microcavity.

At least one microstructure with a quality factor may be located within the microcavity, and the step of measuring may include the steps of vibrating the at least one microstructure and monitoring the quality factor of the at least one vibrating microstructure.

The maximum desired level of pressure within the microcavity may be 50 mTorr or less.

The microcavity may be enclosed by a pair of substrates.

At least one MEMS device may be located within the microcavity.

The at least one microstructure may include a pair of comb resonators.

Yet still further in carrying out the above objects and other objects of the present invention, a system is provided for monitoring pressure in a vacuum microcavity. The system includes means for measuring pressure in the microcavity, and means for providing a signal when the pressure exceeds a maximum desired level.

The vacuum microcavity may be a sealed microcavity, and the means for measuring may be located in the sealed microcavity.

The means for measuring may include at least one microstructure having a quality factor located within the microcavity, and the means for measuring may further include means for vibrating the at least one microstructure and means for monitoring the quality factor of the at least one vibrating microstructure.

In carrying out the above object and other objects of the present invention, a method for controlling pressure in a vacuum microcavity is provided. The method includes measuring pressure in the microcavity and providing a feedback signal when the pressure exceeds a maximum desired level. The method also includes reducing the pressure in the microcavity to a pressure at or below the maximum desired level in response to the feedback signal to compensate for vacuum degradation within the vacuum microcavity.

The vacuum microcavity may be a sealed microcavity such that the steps of measuring and reducing are performed in the sealed microcavity.

At least one microstructure with a quality factor may be located within the microcavity. The step of measuring may include the steps of vibrating the at least one microstructure and monitoring the quality factor of the at least one vibrating microstructure.

The step of reducing may include the step of gettering gas within the microcavity.

Further in carrying out the above object and other objects of the present invention, a system for controlling pressure in a vacuum microcavity is provided. The system includes means for measuring pressure in the microcavity and providing a feedback signal when the pressure exceeds a maximum desired level. The system also includes means for reducing the pressure in the microcavity to a pressure at or below the maximum desired level in response to the feedback signal to compensate for vacuum degradation within the microcavity.

The microcavity may be a sealed microcavity wherein the means for measuring and the means for reducing are located in the sealed microcavity.

The means for measuring may include at least one microstructure having a quality factor located within the microcavity, and the means for measuring may further include means for vibrating the at least one microstructure and means for monitoring the quality factor of the at least one vibrating microstructure.

The means for reducing may include means for gettering gas within the microcavity.

Still further in carrying out the above objects and other objects of the present invention, a method for trimming resonant frequency of a microstructure located within a vacuum microcavity is provided. The method includes locally depositing material onto the microstructure to increase mass of the microstructure whereby resonant frequency of the microstructure is decreased.

The step of locally depositing may include the step of controllably heating the microstructure.

The microstructure may have a resistance, and the step of heating may include the step of causing an electrical current to flow through the microstructure to heat the microstructure.

Further in carrying out the above objects and other objects of the present invention, a system is provided for trimming resonant frequency of a microstructure located within a vacuum microcavity. The system includes a power supply and means for transferring power from the power supply to the microstructure so that the microstructure converts the transferred power to a controlled amount of heat over a period of time sufficient to getter material within the microcavity onto the microstructure whereby resonant frequency of the microstructure is decreased.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1 is a block diagram schematic view illustrating various components of a control system of the present invention;

FIG. 2 is a block diagram flow chart illustrating various steps of the methods of the present invention;

FIG. 3(a) is a perspective schematic view of an incomplete bonding ring formed on a substrate with a sealing heater located at a sealing channel formed in the bonding ring;

FIG. 3(b) is a pair of side sectional views which illustrate the closure of the sealing channel by localized heating;

DETAILED DESCRIPTION OF THE PREFERRED EMBODIMENTS

Figure 3C:
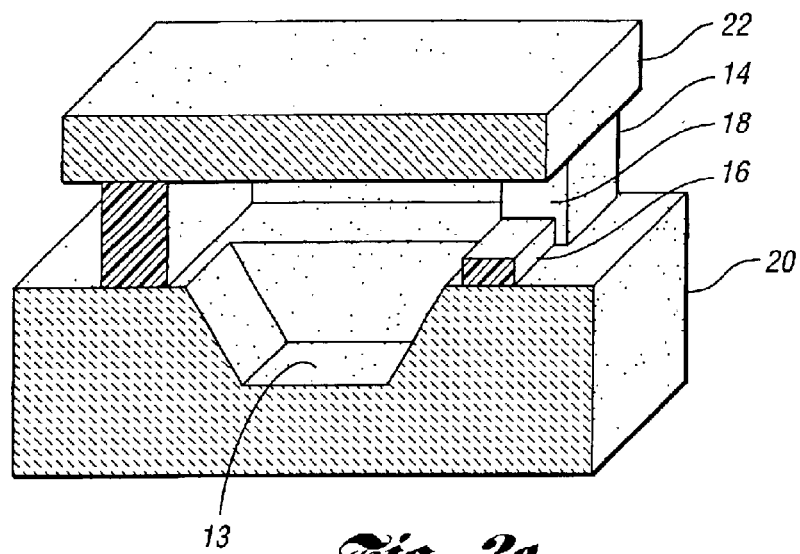
FIG. 3(c) is a perspective schematic view, in cross-section, further illustrating the sealing channel of FIGS. 3(a) and 3(b)

In general, a post-packaging pressure control scheme integrated with a wafer-level packaging technique is described to address the problems associated with the prior art. The post-packaging pressure control scheme offers a closed-loop, in-chamber pressure monitoring and active pressure control capability to the packaged cavity. This scheme is designed to minimize vacuum degradation in the packaged vacuum microcavity over time, hence improving device performance and lifetime. The wafer-level packaging technique, which is fully compatible with various device fabrication methods (including bulk-micromachining, surface-micromachining, and dissolved wafer process), can be applied to many existing high-performance MEMS devices. This packaging technique is designed to eliminate the high, and unpredictable residual pressures by providing a low and consistent base pressure inside the vacuum microcavity.

Post-Packaging Pressure Control Scheme

The general approach of this system is to package devices in a low-pressure environment, and to actively maintain the pressure below a critical level internally with a pressure switch. All of the components in this system can be integrated and are processed at wafer-level. This gives a tremendous cost advantage over many active pressure control systems. In addition, an accurate pressure reading inside the cavity is not required as long as the pressure is below an upper level. For high performance pressure sensors and resonators, this upper level is in the order of a few tens of mTorr.

Three important system components are the first-level package 10, a pressure-monitoring unit 12, and an in-chamber pressure control unit. These components are illustrated in FIG. 1. The purpose of the first-level packaging 10 is to provide a good base pressure inside the cavity. It can be achieved by the packaging technique described in the next section. The pressure-monitoring unit 12 is used to assess the quality of the vacuum seal and to act as a pressure switch to trigger the pressure control unit if necessary. The function of the pressure control unit is to maintain the pressure at a desired reference level. Passive getters are also incorporated to improve the system performance.

The system flow chart is shown in FIG. 2. The system device is first designed and fabricated. It is then packaged at the wafer-level followed by any higher-level packaging if needed. Once packaged, the device should be in the normal operation mode. The cavity pressure is then monitored periodically. In the event of vacuum degradation higher than the desired level, pressure control is activated by the pressure-monitoring unit 12 which restores the pressure back to the desired level.

Wafer-Level Packaging

A wafer-level packaging technique that combines bonding and localized heating is utilized to provide a low and predictable pressure in the packaged cavity is now described with reference to FIGS. 3a and 3b. First, an open cavity 13 with a sealing heater 16 located at its cavity opening 18 (access hole) formed between silicon and glass substrates 20 and 22, respectively. The cavity 13 can be formed by many bonding techniques. For purposes of illustration, the cavity 13 shown in FIGS. 3a and 3b is formed by a recess in the silicon substrate 20, an incomplete polysilicon bonding ring 14, and the glass wafer 22. With this open cavity design, gases generated during the bonding process (which is the main contributor to the high and unpredictable residual pressure), can be pumped out of the cavity 13 through the access hole 18.

FIG. 3(c) is a simplified schematic perspective view, in cross-section, of the resulting structure and particularly illustrating the sealing channel 18.

The cavity 13 is then sealed by plugging the access hole 18 in a well-controlled vacuum environment. This can be achieved either by localized CVD in a low-vacuum reactive gas environment (illustrated in FIG. 3b) or by localized heating and thus reflowing the materials to form a plug 26 which plugs the access hole 18 in a low-vacuum environment. With this approach, the cavity 13 can be sealed at a controlled pressure near ambient temperature.

Stimulation and Working Models

A test module has been designed and fabricated to demonstrate this packaging technique. A combination of anodic bonding and localized heating is implemented to package microresonators at the first-level. Comb resonators were chosen as the pressure-monitoring unit 12 because no additional processing is required for these structures. A suspended polysilicon microheater was chosen as the active pressure control unit. A detailed process flow is presented in FIGS. 4a–4h.

However, it is to be understood that while vibrating-type pressure sensors are described herein (specifically the comb-drive resonators), pressure-sensitive measuring devices based on other principles can also be used/integrated in the microcavity. Some of these devices include thermocouple gauges, Pirani gauges, and ionization gauges that measure pressure indirectly; capacitance nanometers, such as piezoelectric, piezoresistive parallel plate capacitive pressure sensors, are examples of devices that measure pressure directly.

Figure 4A:
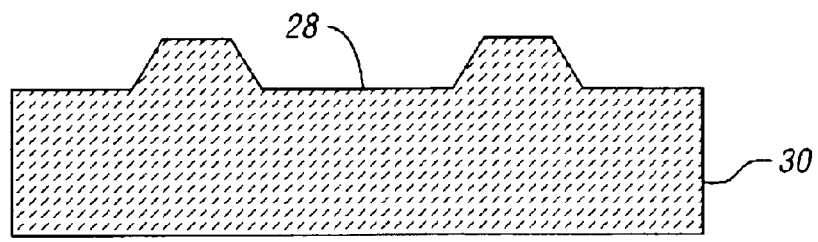
FIGS. 4(a)–4(h) are side sectional views illustrating various steps in making a device which incorporates the systems of the present invention.

As shown in FIG. 4(a), fabrication begins with a 4 $\mu$m KOH cavity recess 28 formed in a silicon substrate 30, followed by 4 min CMP. The purpose of the CMP step is not to polish the recess surface, but rather to smooth the edge profile created by the anisotropic etch. This CMP step eases the lithography process by reducing photoresist buildup on the edge of the recess 28 and eliminates overdeveloping of the features outside the recess area. In addition, since there is a second CMP step required later in the process to polish a bonding polysilicon layer, this step also prevents material loss at the edges in the bonding layer. Leads can be destroyed if a substantial amount of material is lapped away during the CMP process.

Figure 4B:
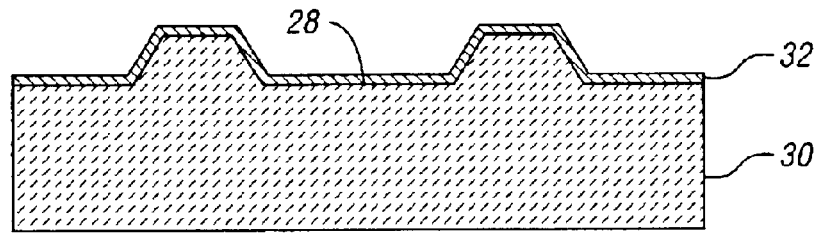

As shown in FIG. 4(b), a layer 32 of $SiO_2/Si_3N_4$ (2 $\mu$m/3000 Å) is deposited and patterned on the substrate 30.

Figure 4C:
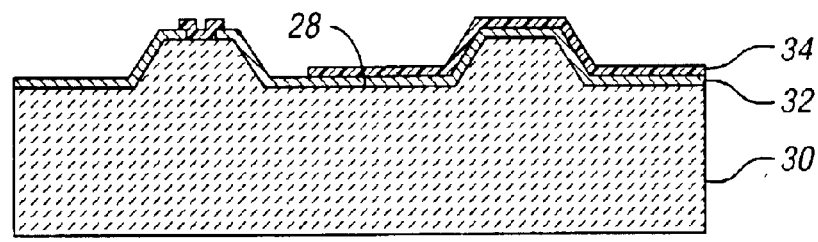
Figure 4D:
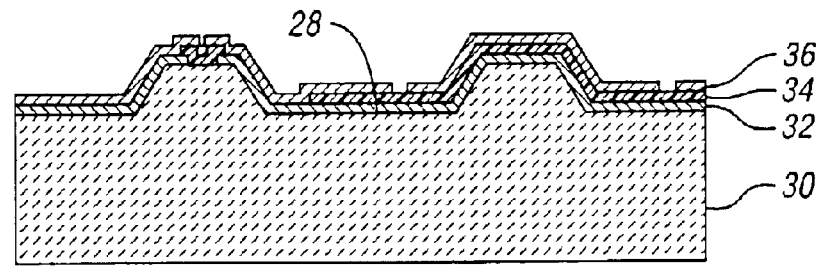
Figure 4E:
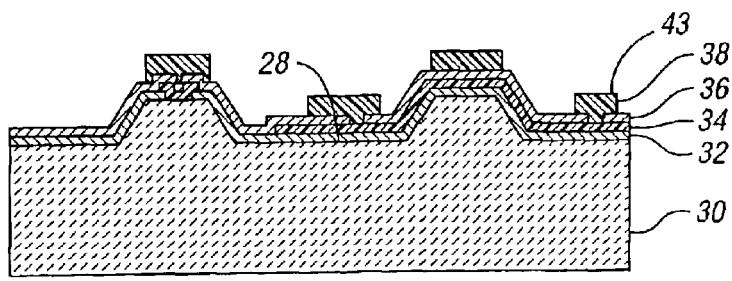
Figure 4F:
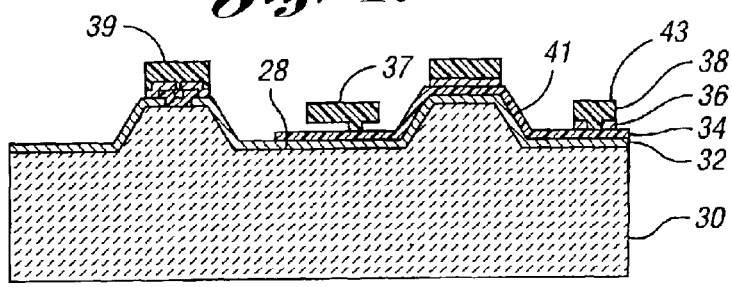
Figure 4G:
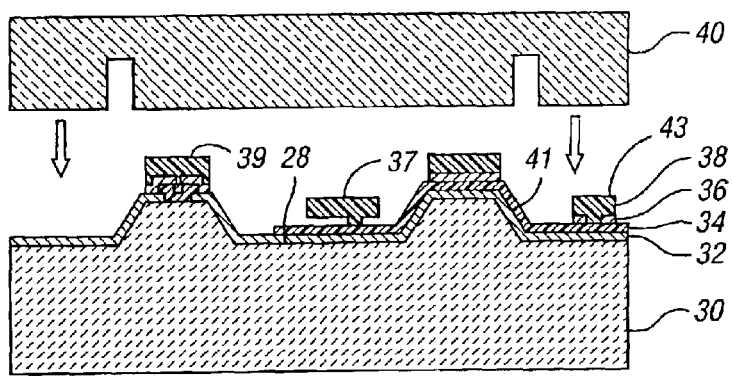
Figure 4H:
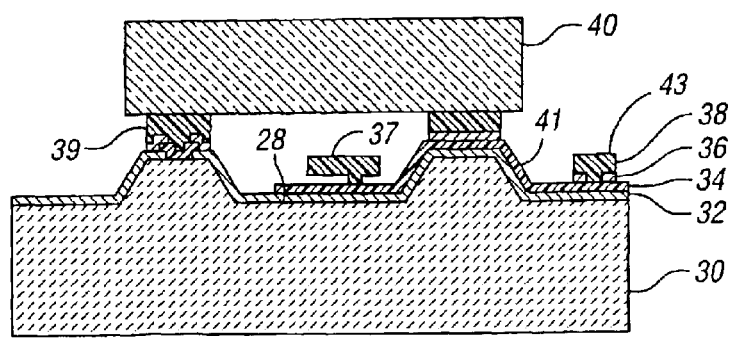

As shown in FIG. 4(c), a 1 $\mu$m layer 34 of low-stress polysilicon is then deposited, doped, and patterned to form leads (i.e., 41 in FIGS. 4(*f*)–4(*h*)) and sealing heaters (i.e., 16 in FIGS. 3*a* and 3*b*)).

As shown in FIG. 4(*d*), a second dielectric layer 36 (2 μm, trench-refill dielectric as well as sacrificial oxide) is then patterned to form anchors for comb resonators (i.e., 37 in FIGS. 4(*f*)–4(*h*)) and gettering heaters (i.e., FIG. 1).

As shown in FIG. 4(*e*), a 2 μm low-stress polysilicon structural layer 38 is then deposited, and doped, followed by CMP for planarization. The resonators, including comb resonator 37, gettering heaters, including sealing heater 16 shown in FIG. 3(*c*), and bonding ring 39 are now patterned, and the structures are released in concentrated HF, as shown in FIG. 4(*f*).

Upon device release, a thin layer of LTO (3000 Å) is deposited, and patterned to open contact pads 43. It is observed that the LTO reflows into micro trenches in the bonding ring 39 during the anodic bonding process. This LTO layer is important for a good cavity seal.

To prevent the released structures from being destroyed in the bonding process, a metal shield (Ti/Pt/Au) is patterned on a glass wafer 40 by lift-off for electrostatic protection. The glass wafer 40 is then partially diced, and anodically bonded to the silicon substrate 30 at 400° C. and 1000V for 10 minutes, as shown in FIGS. 4(*g*) and 4(*h*).

As shown in FIG. 4(*h*), the glass wafer 40 is then diced to expose the contact areas 43. The electrostatic shield connections are also destroyed during the dicing process.

After dicing, each individual device is mounted on a standard 24 pin DIP and wire bonded. The package is then placed on a specially-designed board inside the PECVD chamber for localized deposition. Power to the chip is provided by an external current source via an electrical feed-through port. Before the cavity 28 is sealed, the comb resonators 37 are annealed in vacuum by passing currents through their anchors for performance enhancement. Approximately 5 mW of power was delivered to each comb resonator 37 for 10 minutes for this purpose.

After annealing, the resonators 37 and the cavity 28 are sealed at 250 mT for 2 hours with a 40 sccm $SiH_4$ flow. The heater temperature, estimated by monitoring its resistance, is approximately 600° C. In fact, the sealing channel (18 in FIGS. 3(*b*) and 3(*c*)) is overfilled with deposited polysilicon in 2 hours. The actual time for sealing the channel 18 is thought to be less than 1 hour, and optimizing the channel dimensions and sealing conditions could reduce it still further. The package is removed from the PECVD chamber after sealing, and one of the gettering heaters is activated to getter the Si atoms in the cavity 28. Using 130 mW for 5 minutes, the expected cavity pressure after gettering is approximately 30 mTorr.

Figure 5A:
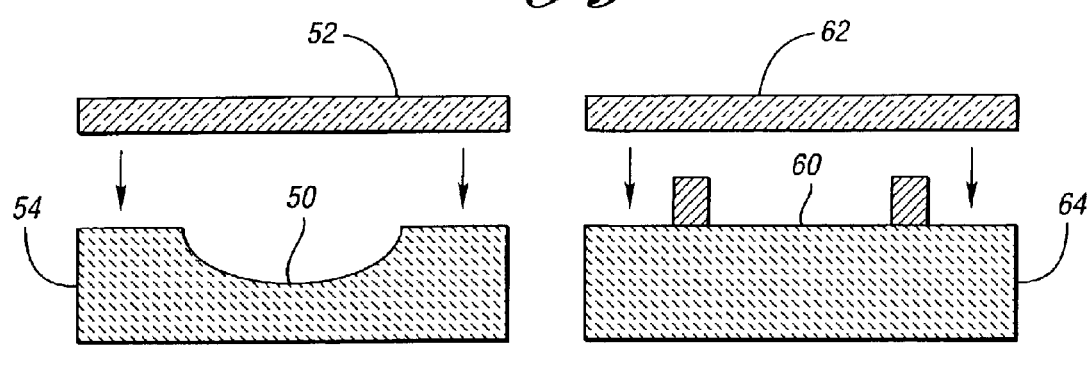
FIGS. 5(a)–5(b) are side sectional views of various substrates and illustrating cavity formation by sealing and device encapsulation, respectively.
Figure 5B:
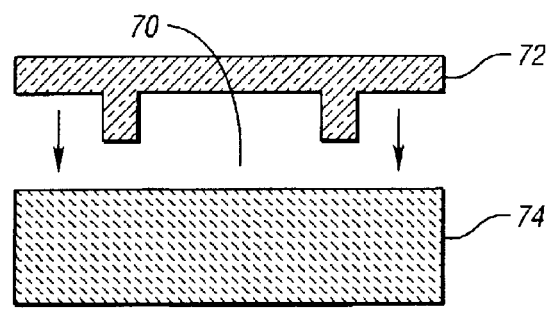

There are alternative methods to form a microcavity. The cavity can be formed between two substrates by almost any bonding or fabrication method. The substrates can be of the same material or dissimilar materials. Formation of cavities can be generalized into two categories: sealing an existing cavity and encapsulating a device. The former can be utilized to seal a pre-etched bulk-micromachined pit or a cavity 50 or a cavity 60 (formed by substrates 52 and 54, and 62 and 64, respectively) formed by additive processes, as shown in FIG. 5(*a*). The other approach is to encapsulate an area with a shell-like structure, as shown in FIG. 5(*b*) to form a cavity 70 between structures 72 and 74. This approach is usually employed on surface-micromachined MEMS structures. Some of the most commonly used fabrication methods are bulk-micromachining, surface-micromachining, and special processes such as the dissolved wafer process. The disclosed packaging method can be applied to almost any cavity with an access hole (i.e., a sealing channel) and a sealing heater.

Figure 6:
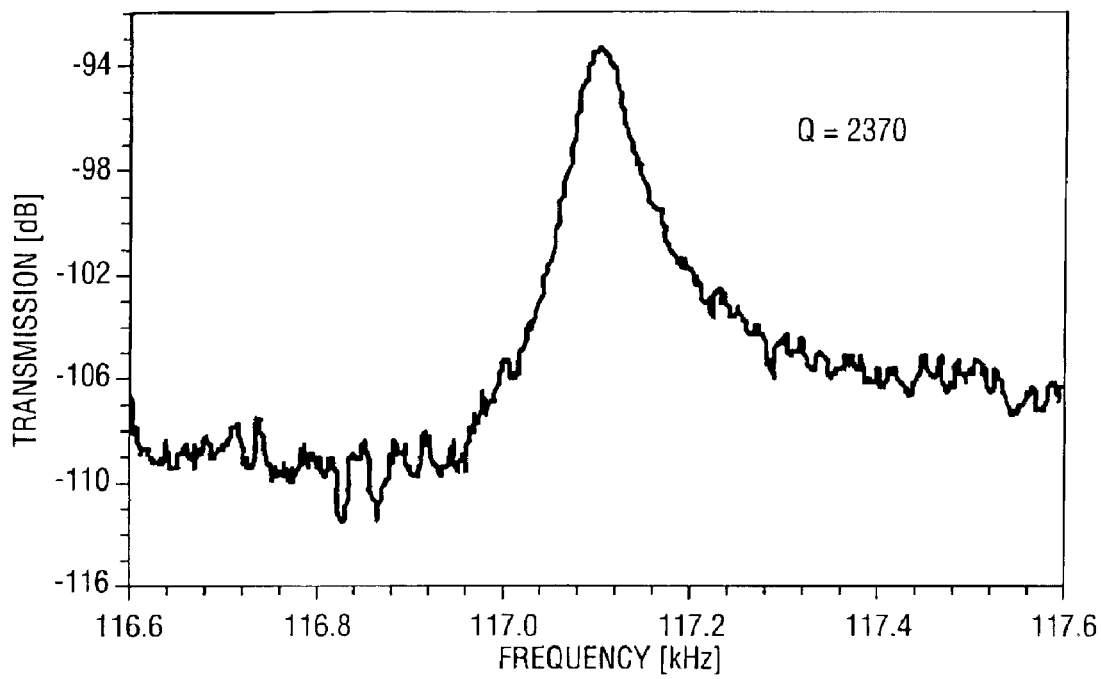
FIG. 6 is a graph of transmission versus frequency and illustrating transmission spectra obtained from a package and a comb resonator.
Figure 7:
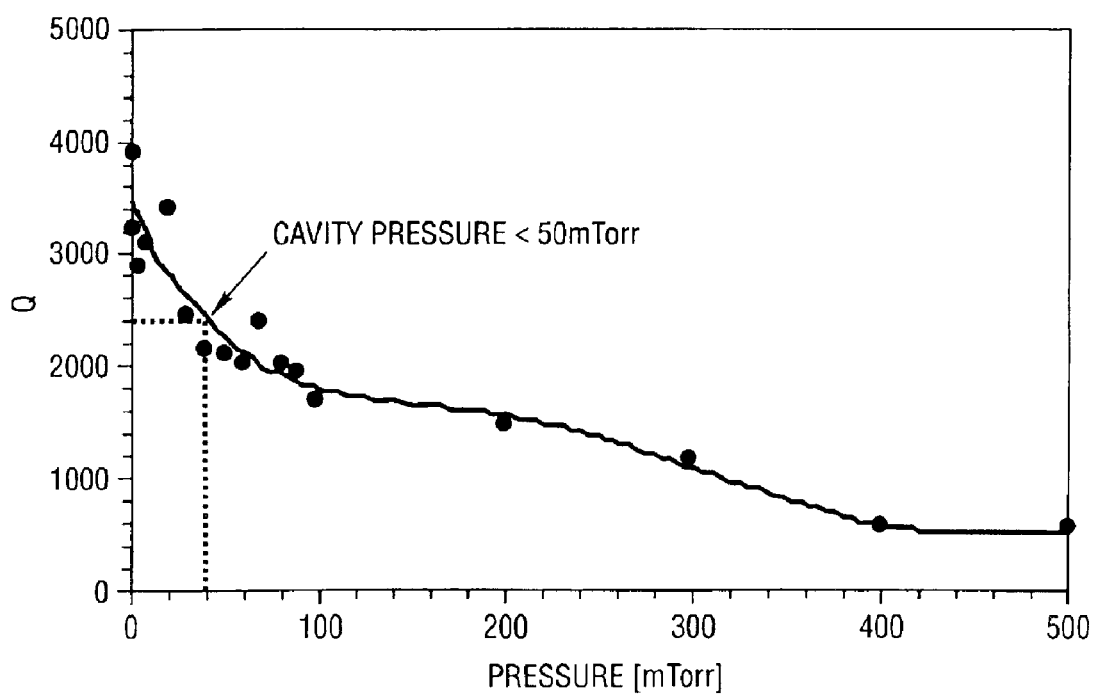
FIG. 7 is a graph of Q versus pressure for an unpackaged resonator.

The packaged comb resonators 37 were tested to evaluate the quality of the seal. This measurement was performed with the package at atmosphere. Quality factors of 2300 were obtained from the packaged resonators 37. FIG. 6 is a typical transmission spectra obtained from a packaged device. To estimate the pressure inside the cavity, the quality factor was measured as a function of pressure for an unpackaged resonator in a vacuum chamber. The data is shown in FIG. 7. A quality factor of 2300 indicates that a cavity pressure below 50 mTorr was achieved.

In summary, the disclosed wafer-level packaging technique and the post-packaging pressure monitoring and control schemes have been implemented. In this case, the vacuum cavity was created using silicon-glass bonding and is subsequently sealed using localized polysilicon CVD. The gas inside the cavity is then locally removed by activating the gettering heaters. Quality factors measured using comb resonators embedded in the cavity indicate that cavity pressures below 50 mTorr can be achieved.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

For example, there are alternative bonding methods to form a vacuum microcavity. Cavity formation can be achieved by many existing bonding methods. Some of those methods which can be applied are, but not limited to: (a) fusion bonding, (b) anodic bonding, (c) eutectic bonding, (d) adhesive bonding (organic or non-organic), and (e) any special techniques developed to bond two substrates.

The disclosed technique can be used to vacuum- or hermetic-package almost any device (sensors, actuators, IC) fabricated by any method.

The pressure-monitoring unit can be any pressure-sensitive device. Some examples are pressure sensors, lateral or vertical resonators, and hot cathode gauges.

The pressure control unit can be an active heater made of any conductive material in any shape (design) with or without a gettering film in its vicinity.

Different reactive or inert gases can be sealed inside the cavity. If a reactive gas is sealed inside the cavity, post-packaging mass trimming can also be implemented by the disclosed technique.

For example, the same localized mass deposition method (local sealing utilized to plug the cavity passageway can be used to trim resonant frequency of a vibrating element, such as lateral or vertical microresonators. The resonant frequency of such element is a function of mass and effective spring constant of the device/system. The general relationship between the three parameters can be described as:
Resonant frequency, $$f = \sqrt{\frac{k}{m}},$$

where k is the spring constant and m is the mass.

Since the cavity is sealed by activating the sealing heater in a reactive gaseous environment, the same gas is sealed inside the cavity and can be utilized for mass trimming purposes. This gas sealed inside of the cavity can be gettered by activating the pressure control unit, which is a suspended polysilicon heater. More specifically, the Si atoms present in the reactive gas (i.e., silane, $SiH_4$) can be gettered onto the polysilicon heater in the solid form, leaving only $H_2$ (hydrogen gas) behind in the cavity. This reaction reduces the pressure inside the cavity, which was how pressure control/reduction was achieved.

Instead of using a separate pressure control unit (or polysilicon heater), one can heat a vibrating microstructure (such as a comb resonator) by applying current to it, and locally deposit Si onto the microstructure. This deposition changes the overall mass of the structure hence the frequency of the microstructure. The remaining gas in the cavity after trimming can be further reacted away by the pressure control unit.

In this way, post-packaging mass/frequency trimming is possible. Precise post-packaging frequency trimming is possible with proper control of the current applied to the microstructure as well as by controlling the pressure of the reactive gas sealed inside the cavity. Post-packaging trimming is a valuable method to achieve precise frequency of MEMS devices required for many high performance applications and to eliminate frequency changes of the structure during packaging steps.

There are alternative ways to seal the access hole (or the sealing channel). Different materials can be deposited by localized CVD, some of the materials are, but not limited to, polysilicon, silicon dioxide, and silicon nitride. Instead of depositing material, the sealing heater can provide localized heating to reshape or induce chemical or physical change in pre-deposited materials to plug the channel. Some examples are melting and reflowing solder into the channel, causing material volume expansion or localized oxidation to seal the channel.

The disclosed technique can be applied to initially sealed or unsealed cavities during early fabrication steps. Typically, surface-micromachined devices would benefit from an initially sealed cavity to minimize damage to release structures during fabrication. For an initially sealed cavity, an isotropic dry or wet etch process can be applied to open an access hole when the device is ready to be packaged. It is also possible to selectively open the access hole by activating the sealing heater and locally enhance the etching process. Once the cavity is opened, the disclosed technique can be performed to seal the cavity.

The disclosed technique is process compatible with many existing fabrication techniques wherein a cavity pressure below 50 mTorr can be achieved. The present invention offers post-packaging, closed-loop, in-chamber cavity pressure monitoring and control to compensate for vacuum degradation.

What is claimed is:

1. A method for locally sealing a vacuum microcavity, the method comprising:

providing a device having an access passageway communicating the vacuum microcavity with ambient and a sealing heater supported on the device and located at the access passageway; and plugging the access passageway with pre-deposited material to locally seal the vacuum microcavity wherein the step of plugging includes the step of activating the sealing heater to reshape or induce chemical or physical changes in the pre-deposited material to plug the access passageway wherein the access passageway is formed in and extends through the predeposited material.

2. The method of claim 1 further comprising evacuating gas from the microcavity wherein the sealed microcavity has an initial base pressure therein.

3. A system for locally sealing a vacuum microcavity formed in a device having an access passageway communicating the vacuum microcavity with ambient, the system comprising:

a mechanism for plugging the access passageway with pre-deposited material to locally seal the vacuum microcavity wherein the mechanism includes a sealing heater located at the access passageway and supported on the device for reshaping or inducting chemical or physical changes in the pre-deposited material to plug the access passageway wherein the access passageway is formed in and extends through the pre-deposited material.

4. A method for locally sealing a vacuum microcavity, the method comprising:

providing a device having an access passageway communicating the vacuum microcavity with ambient; and plugging the vacuum passageway with material to locally seal the vacuum microcavity wherein the step of plugging includes the step of depositing the material by localized CVD.

* * * * *